US010777681B2

(12) United States Patent
Zi et al.

(10) Patent No.: US 10,777,681 B2
(45) Date of Patent: *Sep. 15, 2020

(54) MULTI-LAYER PHOTORESIST

(71) Applicant: Taiwan Semiconductor Manufacturing Co., Ltd., Hsin-Chu (TW)

(72) Inventors: An-Ren Zi, Hsinchu (TW); Ching-Yu Chang, Yilang County (TW); Chin-Hsiang Lin, Hsin-chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/439,534

(22) Filed: Jun. 12, 2019

(65) Prior Publication Data
US 2019/0334028 A1  Oct. 31, 2019

Related U.S. Application Data

(63) Continuation of application No. 15/965,417, filed on Apr. 27, 2018, now Pat. No. 10,381,481.

(51) Int. Cl.
*H01L 29/78* (2006.01)
*G03F 7/20* (2006.01)
*H01L 21/8234* (2006.01)
*H01L 29/66* (2006.01)

(52) U.S. Cl.
CPC ........ *H01L 29/785* (2013.01); *G03F 7/70033* (2013.01); *H01L 21/823431* (2013.01); *H01L 29/66795* (2013.01)

(58) Field of Classification Search
None
See application file for complete search history.

(56) References Cited

U.S. PATENT DOCUMENTS

| 5,246,996 | A  | 9/1993  | McVie et al. |
| 7,202,013 | B2 | 4/2007  | Ogihara et al. |
| 7,303,855 | B2 | 12/2007 | Hatakeyama et al. |
| 7,678,529 | B2 | 3/2010  | Ogihara et al. |

(Continued)

OTHER PUBLICATIONS

T. Kozawa & S. Tagawa, "Radiation Chemistry in Chemically Amplified Resists", The Institute of Scientific and Industrial Research, 2010, pp. 1-19, 49 030001, Japanese Journal of Applied Physics, Osaka, Japan.

(Continued)

*Primary Examiner* — Angel Roman
(74) *Attorney, Agent, or Firm* — Haynes and Boone, LLP

(57) ABSTRACT

A method includes spin-coating a first metal-free layer over the substrate, depositing a metal-containing layer over the first metal-free layer, spin-coating a second metal-free layer over the first metal-containing layer, forming a photoresist layer over the second metal-free layer, the photoresist layer including a first metallic element, exposing the photoresist layer, and subsequently developing the photoresist layer to form a pattern. The metal-containing layer includes a second metallic element selected from zirconium, tin, lanthanum, or manganese, and the first metallic element is selected from zirconium, tin, cesium, barium, lanthanum, indium, silver, or cerium.

20 Claims, 11 Drawing Sheets

(56) References Cited

U.S. PATENT DOCUMENTS

| | | | |
|---|---|---|---|
| 8,048,615 B2 | 11/2011 | Takei et al. |
| 8,796,666 B1 | 8/2014 | Huang et al. |
| 8,822,243 B2 | 9/2014 | Yan et al. |
| 8,859,673 B2 | 10/2014 | Rutter, Jr. et al. |
| 8,987,142 B2 | 3/2015 | Lee et al. |
| 9,012,132 B2 | 4/2015 | Chang |
| 9,028,915 B2 | 5/2015 | Chang et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,213,234 B2 | 12/2015 | Chang |
| 9,223,220 B2 | 12/2015 | Chang |
| 9,256,133 B2 | 2/2016 | Chang |
| 9,310,684 B2 | 4/2016 | Meyers et al. |
| 9,501,601 B2 | 11/2016 | Chang et al. |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 9,876,114 B2 | 1/2018 | Huang |
| 2003/0198877 A1 | 10/2003 | Pfeiffer et al. |
| 2005/0074689 A1 | 4/2005 | Angelopoulos et al. |
| 2006/0134547 A1 | 6/2006 | Huang et al. |
| 2008/0038662 A1 | 2/2008 | Hatakeyama et al. |
| 2008/0196626 A1 | 8/2008 | Wu et al. |
| 2008/0292995 A1 | 11/2008 | Houlihan et al. |
| 2010/0316949 A1 | 12/2010 | Rahman et al. |
| 2016/0116839 A1 | 4/2016 | Meyers et al. |
| 2017/0271150 A1 | 9/2017 | Chang et al. |
| 2018/0315617 A1 | 11/2018 | Zi et al. |
| 2019/0318927 A1* | 10/2019 | Sun .................. H01L 21/76879 |

OTHER PUBLICATIONS

B.L. Henke, E.M. Gullikson, and J.C. Davis, "X-ray Interactions: Photoabsorption, Scattering, Transmission and Reflection at E=50-30,000 eV, Z=1-92", Jul. 1993, vol. 54, Issue 2, pp. 181-342, Atomic Data and Nuclear Data Tables.

* cited by examiner

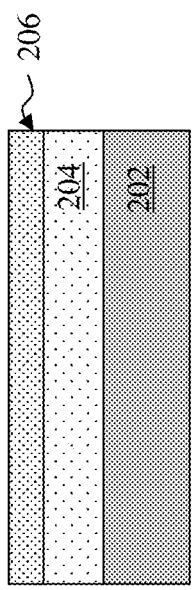
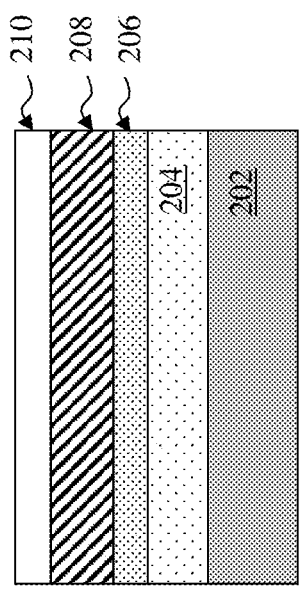
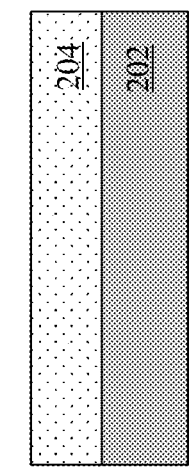
FIG. 2
FIG. 3
FIG. 4
FIG. 5

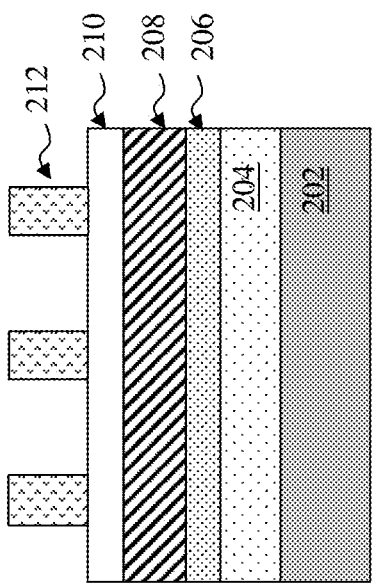
FIG. 13
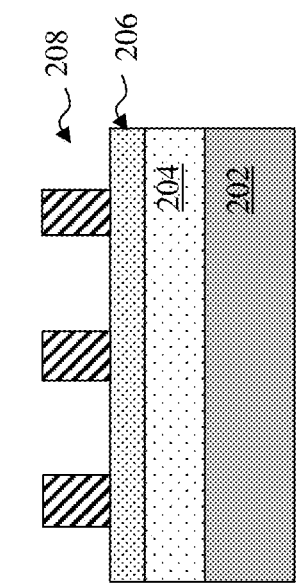
FIG. 15
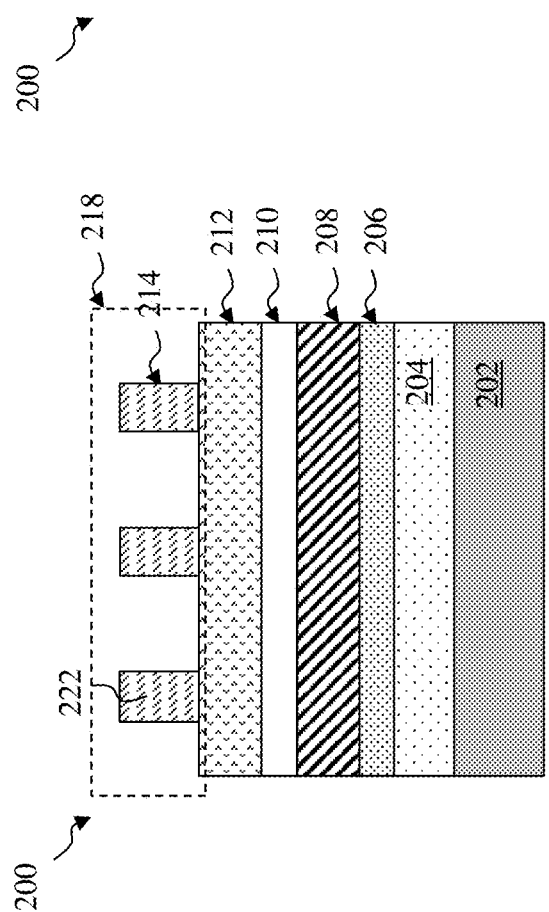
FIG. 12
FIG. 14

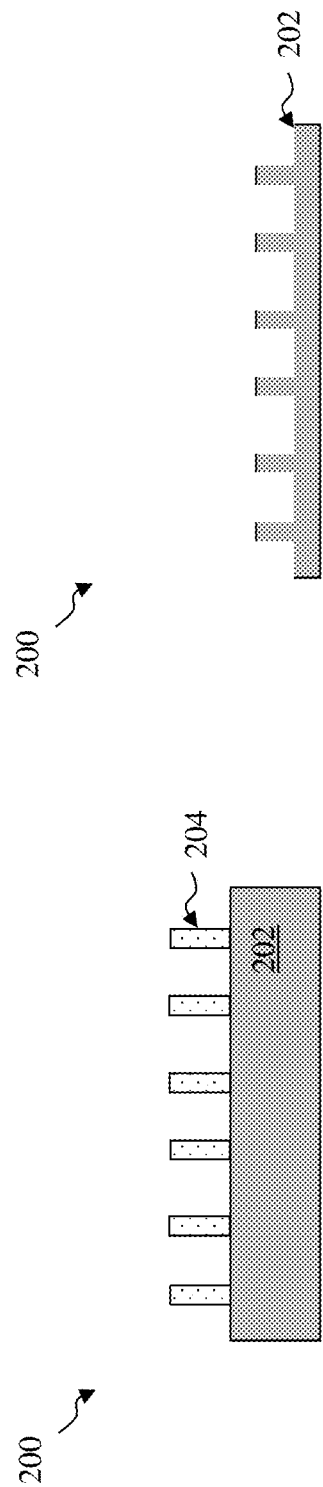

MULTI-LAYER PHOTORESIST

PRIORITY DATA

This application is a continuation of U.S. patent application Ser. No. 15/965,417, now U.S. Pat. No. 10,381,481, filed Apr. 27, 2018 and entitled "Multi-Layer Photoresist," which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

In one exemplary aspect, photolithography (or simply "lithography") is a process used in micro-fabrication, such as semiconductor fabrication, to selectively remove parts of a thin film or a substrate. The process uses light to transfer a pattern (e.g., a geometric pattern) from a photomask to a light-sensitive layer (e.g., a photoresist layer) on the substrate. Recently, an extreme ultraviolet (EUV) radiation source has been utilized to provide reduced feature sizes due to its short exposure wavelengths (e.g., less than 100 nm). However, at such small dimensions, roughness of the edges of patterned features has become difficult to control during lithography processes. Accordingly, efforts have been made in modifying structures and compositions of photoresist materials to control such roughness and ensure proper patterning results. Though such modifications have been generally beneficial, they have not been entirely satisfactory. For these reasons and others, additional improvements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8, and 9 and 12, 13, 14, 15, 16, 17, 18, 19, 20, 21, 22, 23, and 24 are fragmentary cross-sectional views of an exemplary workpiece at intermediate steps of an exemplary method according to various aspects of the present disclosure.

DETAILED DESCRIPTION

Figure 1A:
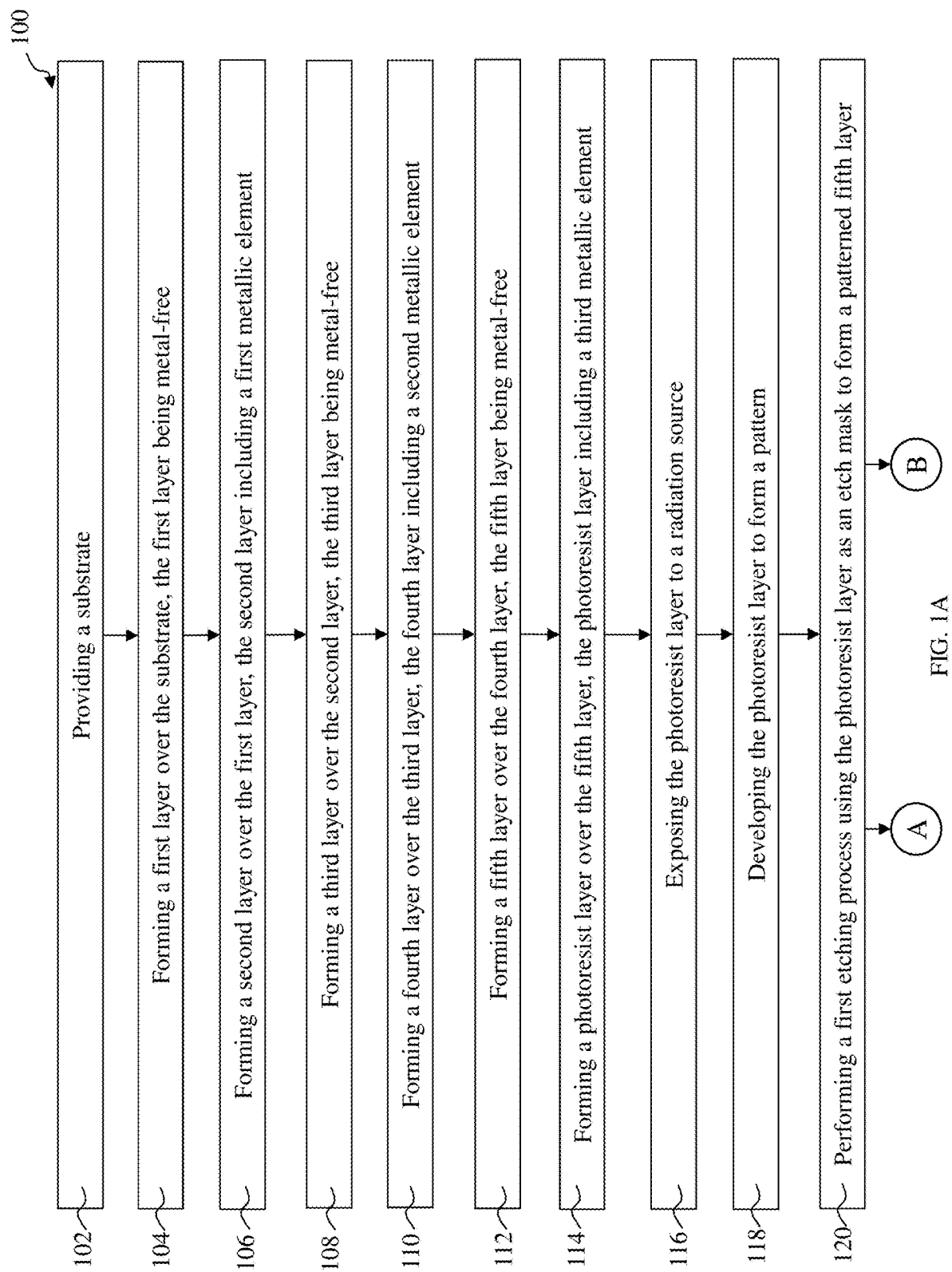
FIGS. 1A, 1B, and 1C illustrate a flowchart of an exemplary method according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates generally to IC device manufacturing and, more particularly, to device patterning processes using a multi-layer photoresist structure. Photoresist line edge roughness (LER) and/or line width roughness (LWR) plays an increasingly critical role when the dimension of a semiconductor feature decreases to less than 20 nanometers. Such roughness in feature morphology may result from factors such as, for example, the amount of photon absorbed by the photoresist material and etching selectivity of each material layer underneath the photoresist material. Though a tri-layered photoresist structure including a photoresist layer, a middle layer (e.g., a hard mask layer), and a bottom layer (e.g., bottom anti-reflective coating, or BARC) formed on a substrate has generally demonstrated adequate results, further improvements. Accordingly, the present disclosure provides a multi-layer photoresist structure and corresponding fabrication methods for improving feature roughness during lithography patterning processes.

Figure 1B:
Figure 1C:
Figure 10:
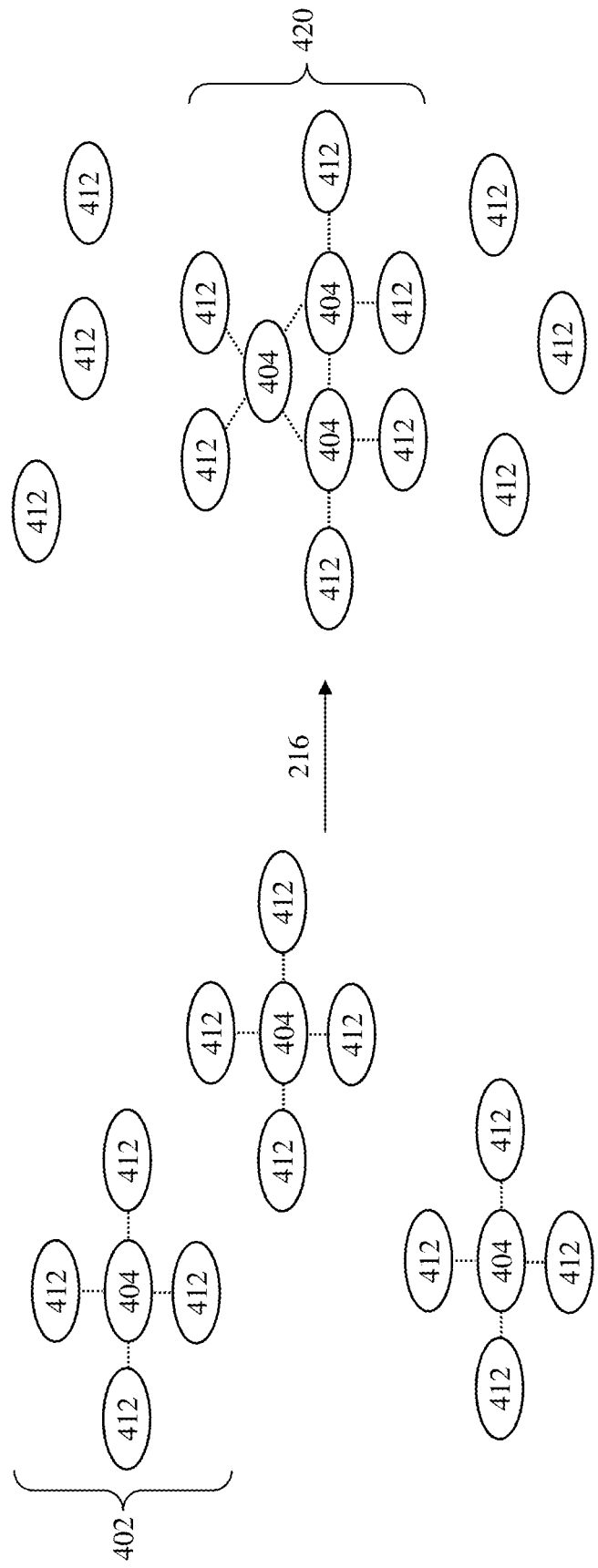
FIGS. 10 and 11 are schematic representations of exemplary chemical structures according to various aspects of the present disclosure.
Figure 11:
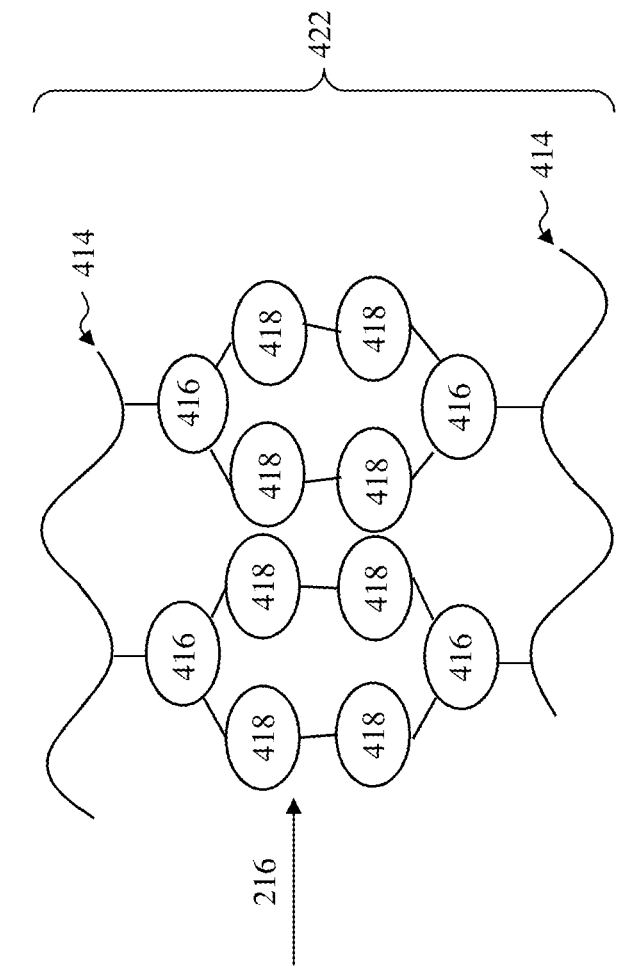
Figure 11:
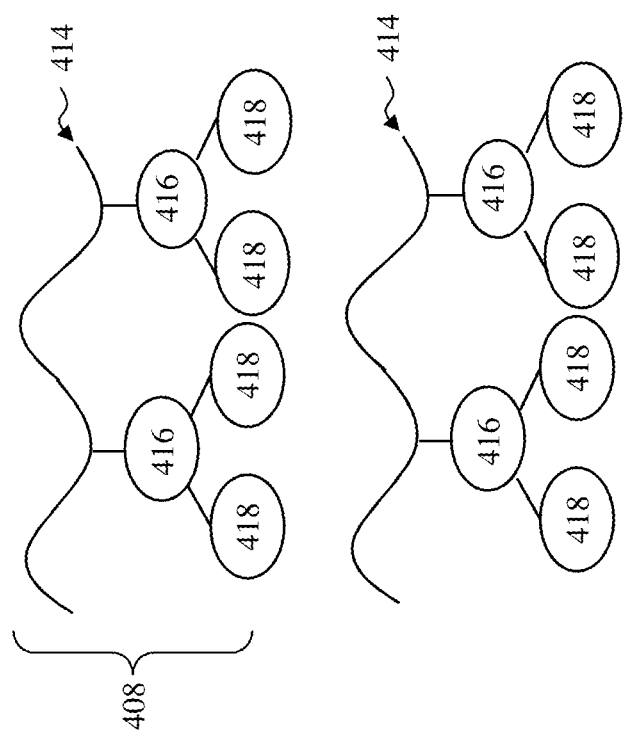

FIGS. 1A-1C illustrate a flowchart of a method 100 for patterning a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to cross-sectional views of the workpiece 200 as shown in FIGS. 2-9 and 12-24, while schematic representations of exemplary chemical structures of some embodiments of photoresist materials are shown in FIGS. 10-11. For clarity and ease of explanation, some elements of the figures have been simplified.

Referring to block 102 of FIG. 1A and to FIG. 2, the method 100 provides (or is provided with) a workpiece 200 including a substrate 202 for patterning. The substrate 202 may comprise an elementary (single element) semiconductor, such as germanium and/or silicon in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In other example, the substrate 202 may include a conductive layer, a semiconductor layer, a dielectric layer, other layers, and/or combinations thereof.

The substrate 202 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques.

Referring to block 104 of FIG. 1A and to FIG. 2, the method 100 forms a first layer 204 over the substrate 202. In many embodiments, the first layer 204 is substantially free of any metallic element. In the present disclosure, the phrase "substantially free" denotes that a given material layer comprise an element in a concentration no more than what is considered for an impurity, such as, for example, less than about 0.1 atomic percent. Specifically, the metallic element may be in the form of a pure metal, a metal compound (e.g., a metal oxide, a metal nitride, a metal oxynitride, a metal silicide, a metal carbide, etc.), a metal alloy (e.g., a combination of multiple metallic elements), or a combination thereof. In one such example, the first layer 204 does not include any metallic element (i.e., the concentration of any metallic element is approximately zero).

In one embodiment, the first layer 204 includes a carbon-rich polymer having one of the following structures, where x, y, and z each denotes an integer greater than or equal to 1 and n denotes an integer greater than or equal to 2. In a further embodiment, the first polymer 204 comprises a mixture of polymers having the following structures.

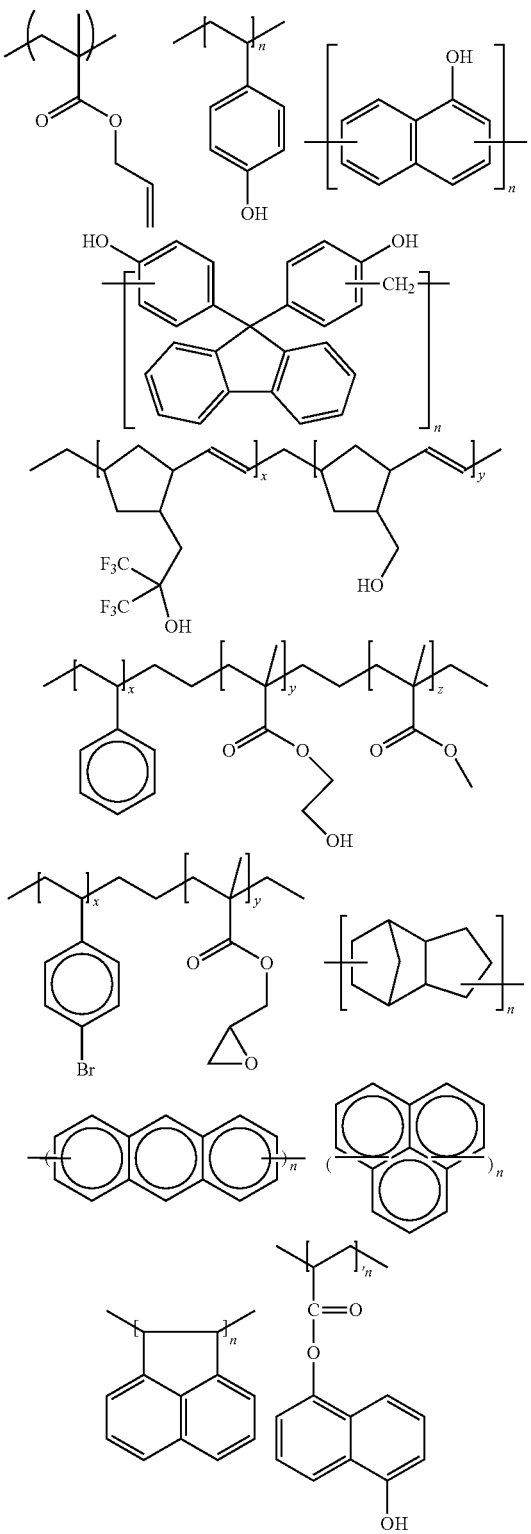

The first layer 204 may be a bottom anti-reflective coating (BARC) whose composition is chosen to minimize reflectivity of a radiation source implemented during exposure of a subsequently-formed photoresist layer.

In another embodiment, the first layer 204 includes a silicon-rich polymer having an exemplary structure as shown below,

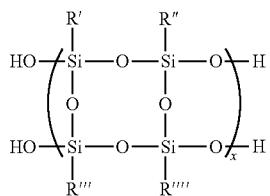

where R, R', R", R'", and R"" are independently selected from aromatic carbon rings each having 1 to 12 carbon atoms, straight or cyclic alkyl, alkoxyl, fluoro alkyl, fluoroalkoxyl chains each having 1 to 12 carbon atoms, straight or cycicic alkene, alkyne, hydroxyl, ketone, aldehyde, carbonate, carboxylic acid, ester, ether, amide, amine, imine, imde, azide, nitrate, nitrile, nitrite, or thiol functional groups each having 1 to 12 carbon atoms, and where x denotes a number of repeating units of the structure within the parentheses and may be between 1 and 30. In many embodiments, R, R', R", R'", and R"" are distinctly different functional groups. In one example, R' may be a chromophore moiety. In another example, R" may be a moiety transparent to the radiation source used to expose a subsequently formed photoresist layer. In yet another example, R'" may be a crosslinking moiety. In a further example, R"" may be a monovalent hydrocarbon group. Alternatively, R, R', R", R'", and R"" may be the same and may each be a hydroxyl group.

In many embodiments, the first layer 204 may be formed by spin-coating the carbon-rich polymer and/or silicon-rich polymer described above onto a top surface of the substrate 202 (or the topmost material layer of a multi-layer substrate 202) and may be formed to any suitable thickness. In some embodiments, the first layer 204 has a thickness of about 50 angstrom to about 500 angstrom. In the depicted embodiment, the thickness of the first layer 204 is about 250 angstrom to about 500 angstrom. The spin-coating process may be implemented by depositing the carbon-rich polymer and/or silicon-rich polymer dissolved in a suitable solvent on the top surface of the substrate 202 followed by or simultaneously with rotating the substrate 202 to cause the carbon-rich polymer and/or silicon-rich polymer to form a thin film across the top surface of the substrate 202. The carbon-rich polymer and/or silicon-rich polymer may be dissolved in any suitable solvent including, for example, n-butyl acetate, methyl n-amyl ketone, 4-methyl-2-pentanol, propylene glycol methyl ether acetate, propylene glycol methyl ether, gamma-butyrolactone, ethyl lactate, cyclohexanone, ethyl ketone, dimethyl formamide, alcohol (e.g., ethanol and methanol), other suitable solvent, or combinations thereof. Subsequently, the solvent is evaporated by baking (i.e., curing) to form the first layer 204. In many embodiments, the baking temperature ranges from about 180 degrees Celsius and about 350 degrees Celsius. Other baking temperatures may also be suitable for evaporating the solvent.

Referring to block 106 in FIG. 1A and FIG. 3, the method 100 forms a second layer 206 over the first layer 204. In many embodiments, the second layer 206 is a metal-containing layer that includes at least one metallic element in the form of a pure metal, a metal compound (e.g., a metal oxide, a metal nitride, a metal oxynitride, a metal silicide, a metal carbide, etc.), a metal alloy (e.g., a combination of multiple metallic elements), or a combination thereof. Non-limiting examples of the metallic element include zirconium, lanthanum, manganese, copper, tantalum, tungsten, hafnium, tin, aluminum, titanium, copper, and cobalt. In many embodiments, the second layer 206 is formed by any suitable process including physical vapor deposition (PVD), chemical vapor deposition (CVD), atomic layer deposition (ALD), low-pressure CVD (LPCVD), plasma-enhanced CVD (PECVD), and/or other suitable techniques, and may be formed to any suitable thickness. In many embodiments, the second layer 206 has a thickness that ranges from about 100 angstrom to about 250 angstrom. If the thickness of the second layer 206 is greater than about 250 angstrom, a pattern subsequently formed in the second layer 206 may collapse due to an increased aspect ratio. On the other hand, if the thickness of the second layer 206 is less than about 100 angstrom, a processing window for etching an underlying layer (e.g., the first layer 204) may be adversely affected. In some embodiments, the second layer 206 has a thickness that ranges from about 20% to about 80% of the thickness of the first layer 204. In the depicted embodiment, the thickness of the second layer 206 is about 100 angstrom to about 200 angstrom. Therefore, in comparison to the thickness of the substantially metal-free first layer 204, the metal-containing second layer 206 is substantially thinner, and may provide desired etching selectivity to the first layer 204 without sacrificing the resolution of the pattern during the etching process.

Referring to block 108 in FIG. 1A and FIG. 4, the method 100 forms a third layer 208 over the second layer 206. In many embodiments, the third layer 208 is substantially metal-free in a similar manner as that discussed above with respect to the first layer 204. In one example, the third layer 208 may include a carbon-rich polymer and/or a silicon-rich polymer as described above. In the depicted embodiment, the third layer 208 may be formed in a similar fashion as the first layer 204, i.e., by a spin-coating process to any suitable thickness. In the depicted embodiment, the third layer 208 is similar in thickness to the first layer 204 and is therefore substantially thicker than the metal-containing second layer 206. In many embodiments, the second layer 206 has a thickness that ranges from about 1% to about 70% of the thickness of the third layer 208. The third layer 208 may subsequently be baked at a temperature ranging from about 180 degrees Celsius to about 350 degrees Celsius following the spin-coating process.

Referring to block 110 in FIG. 1A and FIG. 5, the method 100 forms a fourth layer 210 over the third layer 208. In many embodiments, the fourth layer 210 includes at least one metallic element in the form of a pure metal, a metal compound (e.g., a metal oxide, a metal nitride, a metal oxynitride, a metal silicide, a metal carbide, etc.), a metal alloy (e.g., a combination of multiple metallic elements), or a combination thereof. Similar to the discussion above with respect to the second layer 206, the fourth layer 210 may include one or more of the following metal elements: zirconium, lanthanum, manganese, copper, tantalum, tungsten, hafnium, tin, aluminum, titanium, copper, cobalt, or other suitable elements. In some embodiments, the fourth layer 210 includes a metallic element that is different from that of the second layer 206. In an exemplary embodiment, the fourth layer 210 includes the same metallic element as the second layer 206. In many embodiments, the fourth layer 210 is formed by any suitable process including PVD, CVD, ALD, LPCVD, PECVD, and/or other suitable techniques, and may be formed to any suitable thickness. In an exemplary embodiment, the fourth layer 210 is formed to about the same thickness as the second layer 206 and is therefore substantially thinner than the first layer 204 and the third layer 208. In many embodiments, the fourth layer 210 has a thickness that ranges from about 1% to about 70% of the thickness of the third layer 208 or of the first layer 204.

Figure 6:
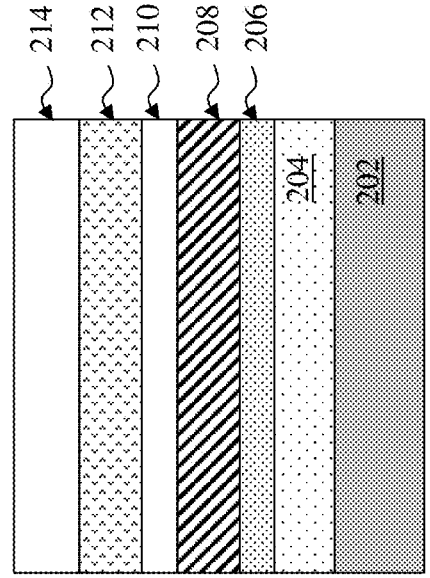

Referring to block 112 in FIG. 1A and FIG. 6, the method 100 forms a fifth layer 212 over the fourth layer 210. In many embodiments, the fifth layer 212 is substantially metal-free as discussed above with respect to the first layer 204 and the third layer 208. In one example, the fifth layer 210 may include a carbon-rich polymer and/or a silicon-rich polymer as described above. In the depicted embodiment, the first layer 204 may be a carbon-rich BARC layer, while the fifth layer 212 may be a silicon-rich layer. In one such example, the fifth layer 212 includes a silicon-rich polymer as discussed with respect to the first layer 204. In many embodiments, the silicon-rich polymer included in the fifth layer 212 may improve adhesion between the underlying layers with the subsequently formed photoresist layer (e.g., the photoresist layer 214). The fifth layer 212 may be formed in a similar fashion as the first layer 204 and the third layer 208, i.e., by a spin-coating process to any suitable thickness. In the depicted embodiment, the fifth layer 212 is similar in thickness to the first layer 204 (and the third layer 208) and is therefore substantially thicker than the fourth layer 210. The fifth layer 212 may subsequently be baked at a temperature ranging between about 150 degrees Celsius and about 500 degrees Celsius following the spin-coating process. In the depicted embodiment, the first layer 204, the second layer 206, the third layer 208, the fourth layer 210, and the fifth layer 212, in portion or in entirety, are together considered a composite structure. In some embodiments, one or more of the first layer 204, the second layer 206, the third layer 208, the fourth layer 210, and the fifth layer 212 are optional and may be omitted depending upon specific design requirements for the workpiece 200 and/or the device from which it is fabricated.

Figure 7:
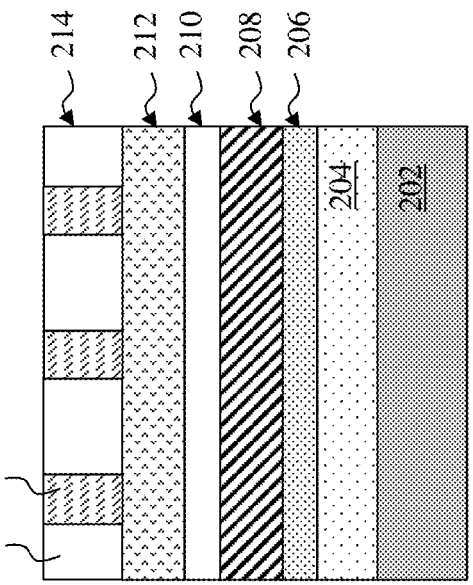
Figure 8:
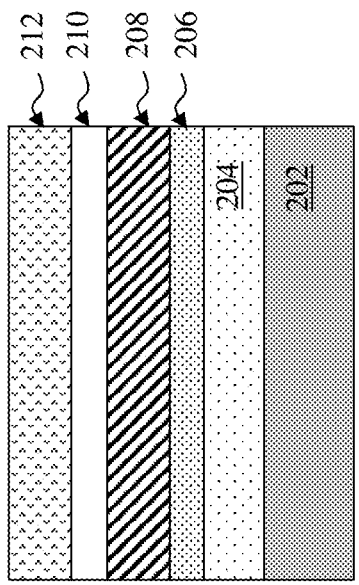

Referring to block 114 in FIG. 1A and FIG. 7, the method 100 forms a photoresist layer 214 over the fifth layer 212. The photoresist layer 214 may be any lithographically sensitive resist material, and in many embodiments, the photoresist layer 214 includes a photoresist material sensitive to a radiation source 216 (e.g., UV light, deep ultraviolet (DUV) radiation, and/or EUV radiation as depicted in FIG. 8). However, the principles of the present disclosure apply equally to e-beam resists and other direct-write resist materials.

The photoresist layer 214 may have a single-layer structure or a multi-layer structure. In one embodiment, the photoresist layer 214 includes a resist material (not depicted) that chemically decomposes (and/or changes polarity) and subsequently becomes soluble in a developer after the resist material is exposed to a radiation source (e.g., the radiation source 216). Alternatively, the photoresist layer 214 includes a resist material that polymerizes (and/or crosslinks) and subsequently becomes insoluble in a developer after the resist material is exposed to a radiation source. Notably, the photoresist layer 214 provided herein is substantially free of any photosensitive functional groups such as, for example, a photo-acid generator (PAG), a thermal-acid generator (TAG), a photo-base generator (PBG), a photo-decomposable base (PDB), a photo-decomposable quencher (PDQ), or other photosensitive functional groups. In the depicted embodiment, the photoresist layer 214 includes a resist material having a structure 402 (referring to FIG. 10), a structure 408 (referring to FIG. 11), or a combination thereof.

Referring to FIG. 10, the structure 402 may be a particle (e.g., a cluster) that includes a core group 404 surrounded by multiple ligands 412. In the depicted embodiment, dotted lines indicate ionic, covalent, metallic, or van der Waals bonds between the core group 404 and the ligands 412. In many embodiments, the core group 404 includes at least one metallic element in the form of a pure metal (i.e., a metal atom), a metallic ion, a metal compound (e.g., a metal oxide, a metal nitride, a metal oxynitride, a metal silicide, a metal carbide, etc.), a metal alloy (e.g., a combination of multiple metallic elements), or a combination thereof. In many embodiments, the core group 404 includes a metallic element the same as that of the second layer 206 and/or the fourth layer 210, such as, for example, zirconium, lanthanum, manganese, copper, tantalum, tungsten, hafnium, tin, aluminum, titanium, copper, cobalt, or other suitable elements. In an exemplary embodiment, the second layer 206 and/or the fourth layer 210 includes one of lanthanum, silver, or cerium, while the core group 404 includes manganese. In some embodiments, the core group 404 may be a metallic oxide (e.g., zirconium oxide) or a pure metal atom (e.g., tin atom). In other embodiments, the core group 404 is a positively charged metallic ion. The ligands 412 may be the same or different from one another and may include a straight or cyclic alkyl, alkoxyl, carboxylic acid, alkene, or other functional groups each having 1 to 12 carbon atoms. In the depicted embodiment, the structure 402 includes the core group 404 and multiple ligands 412 (embodiments are not limited to four ligands 412 as depicted in FIG. 10) organized into a particle (i.e., cluster).

Referring to FIG. 11, the structure 408 may be a polymer chain comprising a backbone 414 and multiple functional groups 416 bonded thereto. The backbone 414 may include any suitable chemical structure and may include one of an acrylate-based polymer, a poly(norbornene)-co-maleic anhydride (COMA) polymer, a poly(hydroxystyrene) polymer, other suitable polymers, or combinations thereof. In many embodiments, the functional group 416 includes at least one metallic element in the form of a pure metal (i.e., a metal atom), a metallic ion, a metal compound (e.g., a metal oxide, a metal nitride, a metal oxynitride, a metal silicide, a metal carbide, etc.), a metal alloy (e.g., a combination of multiple metallic elements), or a combination thereof. In the depicted embodiment, the functional group 416 includes a positively charged metallic ion bonded to two ligands 418. In many embodiments, the functional group 416 includes a metallic element the same as that of the second layer 206 and/or the fourth layer 210, such as, for example, zirconium, lanthanum, manganese, copper, tantalum, tungsten, hafnium, tin, aluminum, titanium, copper, cobalt, other suitable elements, or combinations thereof. In some embodiments, the functional group 416 includes a metallic element such as cesium, barium, lanthanum, cerium, indium, silver, antimony, other suitable elements, or combinations thereof. In the depicted embodiment, the second layer 206 and/or the fourth layer 210 includes lanthanum, silver, or cerium, while the functional group 416 includes manganese. The ligands 418 may be the same as or different from one another and may include a straight or cyclic alkyl, alkoxyl, carboxylic acid, alkene, or other suitable functional groups each having 1 to 12 carbon atoms. In some embodiments, additional functional groups are bonded to the backbone 414 and/or between the backbone 414 and the functional groups 416.

The photoresist layer 214 may be applied by any suitable technique. In some embodiments, the photoresist layer 214 is applied in a liquid form using a spin-on (i.e., spin coating) technique. To facilitate application, the photoresist layer 214 may include a solvent or a mixture of solvents, which when evaporated leaves the photoresist layer 214 in a solid or semisolid form (e.g., a film). Non-limiting examples of solvents include n-butyl acetate, methyl n-amyl ketone, 4-methyl-2-pentanol, propylene glycol methyl ether acetate, propylene glycol methyl ether, gamma-butyrolactone, ethyl lactate, cyclohexanone, ethyl ketone, dimethyl formamide, alcohol (e.g., ethanol and methanol), other suitable solvent, or combinations thereof. The solvent(s) may be driven off as part of the spin coating, during a settling process, and/or during a post-application/pre-exposure baking process. The pre-exposure baking process may be implemented by any suitable equipment such as, for example, a hotplate, at any temperature suitable for the particular compositions of the photoresist layer 214 and the solvent(s) employed.

In other embodiments, the photoresist layer 214 is applied by a deposition method such as, for example, CVD, PVD, ALD, other suitable method, or combinations thereof. In one such example, the photoresist layer 214 may be applied using the same deposition method as that employed for forming the second layer 206 and/or the fourth layer 210.

Referring to block 116 of FIG. 1A and to FIG. 8, the method 100 exposes the photoresist layer 214 to the radiation source 216. In many embodiments, the radiation source 216 may be an Mine (wavelength approximately 365 nm), a DUV radiation such as KrF excimer laser (wavelength approximately 248 nm) or ArF excimer laser (wavelength approximately 193 nm), a EUV radiation (wavelength from about 1 nm to about 100 nm), an x-ray, an e-beam, an ion beam, and/or other suitable radiations. The exposure process 112 may be performed in air, in a liquid (immersion lithography), or in vacuum (e.g., for EUV lithography and e-beam lithography). In the depicted embodiment, the exposure process at block 116 implements a photolithography technique using a photomask 220 that includes a pattern 218 thereon. The photomask 220 may be a transmissive mask or a reflective mask, the latter of which may further implement resolution enhancement techniques such as phase-shifting, off-axis illumination (OAI) and/or optical proximity correction (OPC). In alternative embodiments, the radiation source 216 is directly modulated with a predefined pattern, such as an IC layout, without using a photomask 220 (such as using a digital pattern generator or direct-write mode). In an exemplary embodiment, the radiation source 216 is a EUV radiation and the exposure process at block 116 is performed in a EUV lithography system. Correspondingly, a reflective photomask 220 may be used to pattern the photoresist layer 214.

Figure 9:
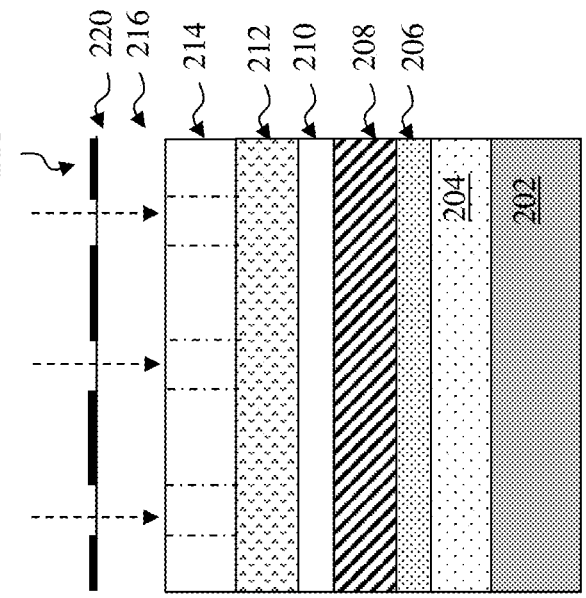

As depicted in FIG. 9, regions 222 of the photoresist layer 214 exposed to the radiation source 216 undergo chemical changes while unexposed regions 230 remain substantially unchanged in chemical properties. With respect to the structures 402 and referring back to FIG. 10, the ligands 412 dissociate from the core groups 404 upon being exposed to the radiation source 216, and a larger particle (i.e., structure 420) is formed that comprises multiple core groups 404 and ligands 412 surrounding the core groups 404. With respect to the structures 408 and referring back to FIG. 11, the ligands 418 of different polymer chains crosslink with each other, effectively forming a network 422 of polymer chains. Accordingly, following the exposure process at block 116, the exposed regions 222 of the photoresist layer 214 undergo polymerization and/or crosslinking of the resist material and may become less soluble to a subsequently applied developer as a result.

Referring to block 118 of FIG. 1A and to FIG. 12, the method 100 performs a developing process on the workpiece 200. The developing process dissolves or otherwise removes either the exposed regions 222 or the unexposed regions 230 depending upon the chemical reactions undergone in the photoresist layer 214 during the exposure process at block 116. In the depicted embodiment, the developing process removes the unexposed regions 230 of the photoresist layer 214. The developing process at block 118 may begin with a post-exposure baking process. Depending on the polymer(s) included in the photoresist layer 214, the post-exposure baking process may catalyze any chemical reaction initiated by the exposure process at block 116. For example, the post-exposure baking process may accelerate a cleaving or crosslinking of the resist material in the photoresist layer 214. Following the optional post-exposure baking process, a developer (not depicted) is applied to the workpiece 200, thereby removing particular regions (regions 222 or regions 230) of the photoresist layer 214. Suitable organic-based developers include n-butyl acetate, ethanol, hexane, benzene, toluene, and/or other suitable solvents, and suitable aqueous developers include aqueous solvents such as tetramethyl ammonium hydroxide (TMAH), KOH, NaOH, and/or other suitable solvents. In the depicted embodiment, the developer is an organic solvent. In many embodiments, a post-exposure bake is performed on the workpiece 200 subsequent to the developing process at block 118 to further stabilize the pattern of the photoresist layer 214.

Referring to block 120 of FIG. 1A and to FIG. 13, the method 100 selectively removes portions of the fifth layer 212 using the patterned photoresist layer 214 as an etch mask. As such, the etching process at block 120 removes portions of the fifth layer 212 without substantially removing portions of the underlying fourth layer 210, thereby demonstrating etch selectivity for the fifth layer 212 over the fourth layer 210. The patterned photoresist layer 214 is subsequently removed from the workpiece 200 by any suitable method.

Specifically, the fifth layer 212 may be etched using any suitable method including a dry etching process, a wet etching process, other suitable etching process, a reactive ion etching (RIE) process, or combinations thereof. In an exemplary embodiment, a dry etching process is implemented and employs an etchant gas that includes an oxygen-containing gas (e.g., $O_2$), a carbon-containing gas (e.g., $C_xH_y$, where x and y may be any integers), a fluorine-containing etchant gas (e.g., $C_xF_y$, $C_xH_yF_z$, $N_xF_y$, and/or $S_xF_y$, where x, y, and z may be any integers), other suitable etchant gases, or combinations thereof. In the depicted embodiment, the method 100 performs the dry etching process for less than about 30 seconds to remove portions of the fifth layer 212. In many embodiments, an etching bias of less than about 1000 W may be implemented for removing portions of the fifth layer 212. Alternatively, no etching bias (i.e., 0 W) may be implemented. For embodiments in which the fourth layer 210 and the photoresist layer 214 both include the same metallic element (e.g., zirconium, tin, and/or lanthanum), similar etching resistance afforded by the metallic element may improve pattern resolution during the etching of the fifth layer 212, which is substantially metal-free.

Referring to block 122 of FIG. 1B and to FIG. 14, the method 100 selectively removes portions of the fourth layer 210 using the patterned fifth layer 210 as an etch mask. As such, the etching process at block 122 removes portions of the fourth layer 210 without substantially removing portions of the underlying third layer 208, thereby demonstrating etching selectivity of the fourth layer 210 over the third layer 208. The patterned fifth layer 212 is subsequently removed from the workpiece 200 by any suitable method. In the depicted embodiment, the patterned fifth layer 212 is removed by plasma ashing or flushing using, for example, oxygen and/or nitrogen plasma. Notably, the method by which the patterned fifth layer 212 is removed does not substantially affect the underlying patterned fourth layer 210, nor does it substantially affect the third layer 208.

In many embodiments, the fourth layer 210, which includes at least one metallic element, is etched using any suitable method including a dry etching process, a wet etching process, other suitable etching process, an RIE process, or combinations thereof. In many embodiments, a dry etching process is implemented, though the dry etching process for removing portions of the fourth layer 210 employs different etchant(s) from that implemented for removing the fifth layer 212, which is substantially metal-free. In one such example, the dry etching process at block 122 employs an etchant gas that includes a chlorine-containing gas (e.g., $Cl_2$, $C_xH_yCl_z$, $C_xCl_y$, $Si_xCl_y$, and/or $B_xCl_y$, where x, y, and z may be any integers), a bromine-containing gas (e.g., HBr and/or $C_xH_yBr_z$), a nitrogen-containing gas (e.g., $N_2$), a hydrogen-containing gas (e.g., $H_2$), an iodine-containing gas, other suitable gases and/or plasmas, or combinations thereof. In the depicted embodiment, a chlorine-containing gas is used as an etchant to remove portions of the fourth layer 210, and the method 100 performs the dry etching process for less than about 30 seconds. In some embodiments, the dry etching process at block 122 is preceded by a cleaning procedure for about 10 seconds to about 3 minutes.

Referring to block 124 of FIG. 1B and to FIG. 15, the method selectively removes portions of the third layer 208 using the patterned fourth layer 210 as an etch mask. As such, the etching process at block 124 removes portions of the third layer 208 without substantially removing portions of the underlying second layer 206, thereby demonstrating etching selectivity of the third layer 208 over the second layer 206. The patterned fourth layer 210 is subsequently removed from the workpiece 200 by any suitable method. In the depicted embodiment, the patterned fourth layer 210 is removed by plasma ashing or flushing using, for example, hydrogen and/or chlorine plasma. Notably, the method by which the patterned fourth layer 210 is removed does not substantially affect the underlying patterned third layer 208, nor does it substantially affect the second layer 206.

Specifically, the third layer 208, which is substantially metal-free, may be etched using any suitable method including a dry etching process, a wet etching process, other suitable etching process, an RIE process, or combinations thereof. In many embodiments, a dry etching process is implemented, though the dry etching process for removing portions of the third layer 208 employs different etchant(s) from that implemented for removing the fourth layer 210, which includes at least one metallic element. In one such example, the dry etching process at block 124 employs an etchant gas that includes an oxygen-containing gas (e.g., $O_2$), a carbon-containing gas (e.g., $C_xH_y$, where x and y may be any integers), a fluorine-containing etchant gas (e.g., $C_xF_y$, $C_xH_yF_z$, $N_xF_y$, and/or $S_xF_y$, where x, y, and z may be any integers), or combinations thereof. In the depicted embodiment, the method 100 performs the dry etching process for less than about 30 seconds to remove portions of the third layer 208. In many embodiments, the third layer 208 may be etched by a process similar to that described with respect to the etching of the fifth layer 212 at block 120.

Figure 16:
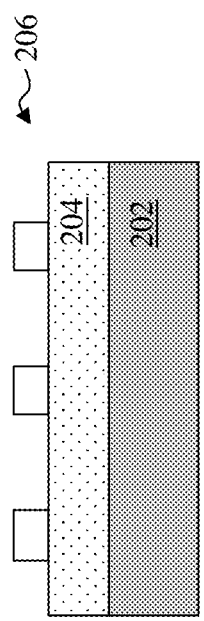
Figure 18:
Figure 19:
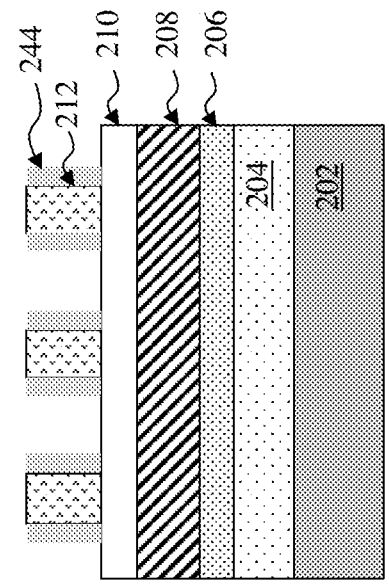

Referring to block 126 of FIG. 1B and to FIG. 16, the method 100 selectively removes portions of the second layer 206 using the patterned third layer 208 as an etch mask. As such, the etching process at block 126 removes portions of the second layer 206 without substantially removing portions of the underlying first layer 204, thereby demonstrating etch selectivity for the second layer 206 over the first layer 204. The patterned third layer 208 is subsequently removed from the workpiece 200 by any suitable method. In the depicted embodiment, the patterned third layer 208 is removed by plasma ashing or flushing using, for example, oxygen and/or nitrogen plasma. Notably, the method by which the patterned third layer 208 is removed does not substantially affect the underlying patterned second layer 206, nor does it substantially affect the first layer 204.

In some embodiments, the second layer 206, which includes at least one metallic element, is etched using any suitable method including a dry etching process, a wet etching process, other suitable etching process, an RIE process, or combinations thereof. In many embodiments, a dry etching process is implemented, though the dry etching process for removing portions of the second layer 206 employs different etchant(s) from that implemented for removing the third layer 208, which is substantially metal-free. In one such example, the dry etching process at block 126 employs an etchant gas that includes a chlorine-containing gas (e.g., $Cl_2$, $C_xH_yCl_z$, $C_xCl_y$, $Si_xCl_y$, and/or $B_xCl_y$, where x, y, and z may be any integers), a bromine-containing gas (e.g., HBr and/or $C_xH_yBr_z$), a nitrogen-containing gas (e.g., $N_2$), a hydrogen-containing gas (e.g., $H_2$), an iodine-containing gas, other suitable gases and/or plasmas, or combinations thereof. In the depicted embodiment, a chlorine-containing gas is used as an etchant to remove portions of the second layer 206, and the method 100 performs the dry etching process for less than about 30 seconds. In many embodiments, the second layer 206 may be etched by a process similar to that described with respect to the etching of the fourth layer 210 at block 122. In some embodiments, the dry etching process at block 126 is preceded by a cleaning procedure for about 10 seconds to about 3 minutes.

Figure 17:
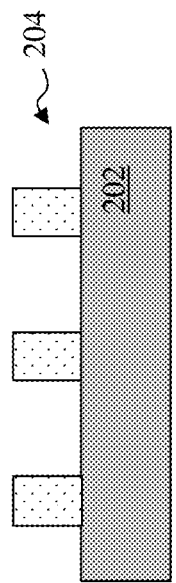

Referring to block 128 of FIG. 1B and to FIG. 17, the method 100 selectively removes portions of the first layer 204 using the patterned second layer 206 as an etch mask. As such, the etching process at block 128 removes portions of the first layer 204 without substantially removing portions of the underlying substrate 202, thereby demonstrating etch selectivity for the first layer 204 over the substrate 202. The patterned second layer 206 is subsequently removed from the workpiece 200 by any suitable method. In the depicted embodiment, the patterned third layer 208 is removed by plasma ashing or flushing using, for example, hydrogen and/or chlorine plasma. Notably, the method by which the patterned second layer 206 is removed does not substantially affect the underlying patterned first layer 204, nor does it substantially affect the substrate 202.

Specifically, the first layer 204, which is substantially metal-free, may be etched using any suitable method including a dry etching process, a wet etching process, other suitable etching process, an RIE process, or combinations thereof. In many embodiments, a dry etching process is implemented, though the dry etching process for removing portions of the first layer 204 employs different etchant(s) from that implemented for removing the second layer 206, which includes at least one metallic element. In one such example, the dry etching process at block 128 employs an etchant gas that includes an oxygen-containing gas (e.g., 02), a carbon-containing gas (e.g., $C_xH_y$, where x and y may be any integers), a fluorine-containing etchant gas (e.g., $C_xF_y$, $C_xH_yF_z$, $N_xF_y$, and/or $S_xF_y$, where x, y, and z may be any integers), or combinations thereof. In the depicted embodiment, the method 100 performs the dry etching process for less than about 30 seconds to remove portions of the first layer 204. In many embodiments, the first layer 204 may be etched by a process similar to that described with respect to the etching of the fifth layer 212 at block 120.

Thereafter, referring to block 130 of FIG. 1B, the method 100 processes the substrate 202 using the patterned first layer 204 as a mask. Any suitable method may be performed to process the substrate 202 including an etching process, a deposition process, an implantation process, an epitaxial growth process, and/or any other fabrication process. In various examples, the processed substrate 202 is used to fabricate a gate stack, to fabricate an interconnect structure, to form non-planar devices by etching to expose a fin or by epitaxially growing fin material, and/or other suitable applications. In the depicted embodiment, referring to FIG. 18, the substrate 202 is etched using the patterned first layer 204 as an etch mask. The substrate 202 may be etched using any suitable method including a dry etching process, a wet etching process, other suitable etching process, an RIE process, or combinations thereof. The patterned first layer 204 is subsequently removed using any suitable method such as, for example, by plasma ashing or flushing using oxygen and/or nitrogen plasma.

Referring to block 132 of FIG. 1B, the workpiece 200 may then be provided for additional fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

In many embodiments, successive etching of alternating metal-free (e.g., the first layer 204, the third layer 208, and the fifth layer 212) and metal-containing layers (e.g., the second layer 206 and the fourth layer 210) leads to improved etching selectivity, which may further lead to reduced LWR and/or critical dimension (CD). In an exemplary embodiment, each pair of the alternating layers reduces the LWR by between about 3% and about 20% and the CD by between about 10% and about 20%. Advantageously, the multi-layer photoresist material provided herein may also be coupled with other patterning strategies to further reduce feature sizes without compromising pattern resolution.

In one such example, referring to blocks 134 to 146 of the method 100 shown in FIG. 1C, a pitch-splitting patterning process is performed after the pattern 218 is formed in the fifth layer 212 at block 120 of FIG. 1A. Specifically, referring to block 134 in FIG. 1C and to FIG. 19, the method 100 deposits a layer 240 of spacer material over the patterned fifth layer 212, which has a pitch 242 (i.e., the smallest dimension between two adjacent features). The spacer material may be any suitable material including a dielectric material such as an oxide, a nitride, an oxynitride, a carbide, or a combination thereof. Notably, the spacer material is substantially free of a metallic element, a silicon-rich polymer, or a carbon-rich polymer such that the spacer material may be selective etched during the subsequent processes. The spacer material may be deposited using any suitable method such as CVD, PVD, ALD, other suitable methods, or a combination thereof.

Figure 20:
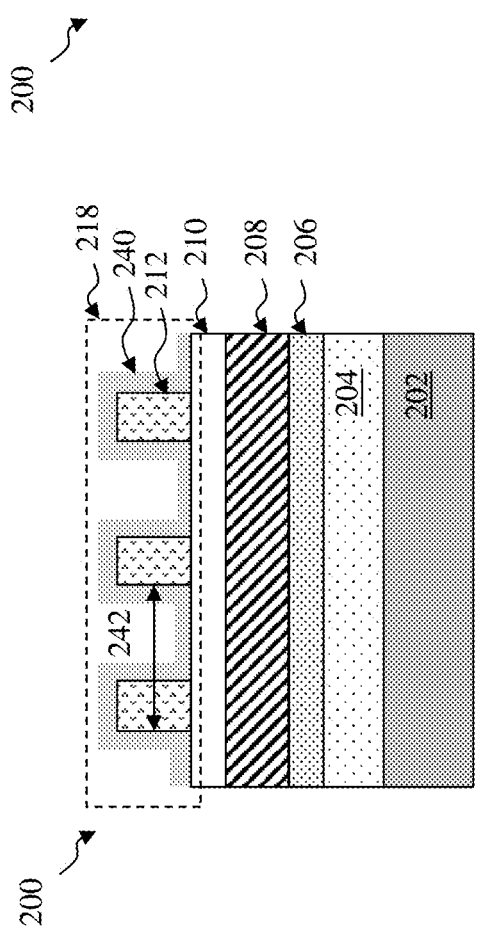
Figure 21:
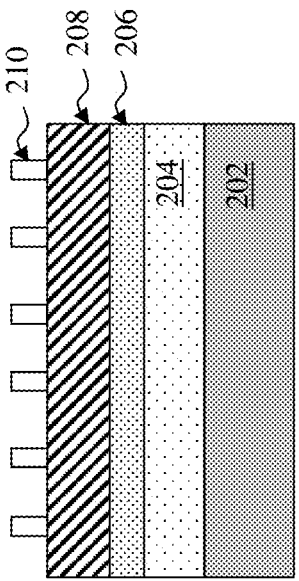
Figure 22:
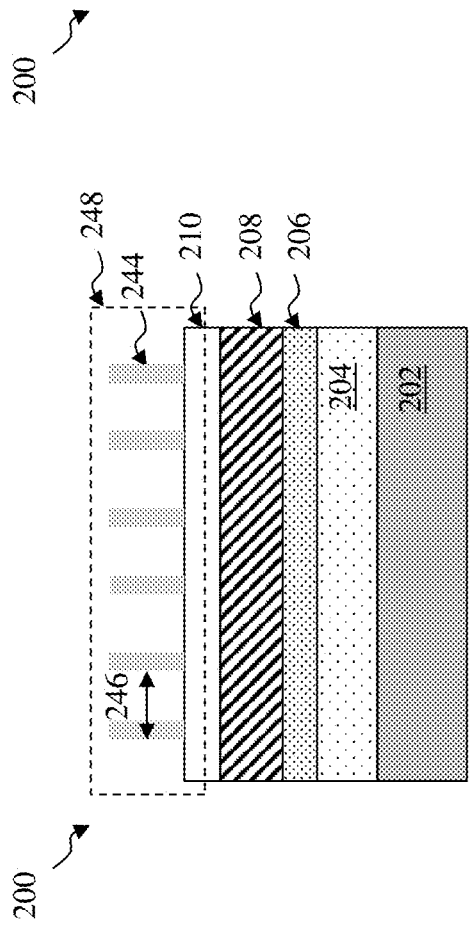

Referring to block 136 in FIG. 1C and to FIG. 20, the method anisotropically etches (e.g., by a dry etching process) the layer 240 of spacer material such that spacers 244 are formed along sidewalls of mandrels present in the patterned fifth layer 212. Referring to block 138 of FIG. 1C and to FIG. 21, the method 100 removes the patterned fifth layer by an etching process similar to that discussed with respect to block 120 of FIG. 1A. In the depicted embodiment, the etching process at block 138 selectively removes the patterned fifth layer 212 without substantially removing the spacers 244, resulting in a pattern 248 having a pitch 246. Because for each mandrel of the pattern 218 two spacers 244 are formed, the pitch 246 is effectively half of the pitch 242. Referring to block 140 of FIG. 1C and to FIG. 22, the method 100 etches the fourth layer 210 using the spacers 244 as an etch mask. In some embodiments, the fourth layer 210 may be etched in a similar process using similar etchant(s) as those discussed with respect to block 122 of FIG. 1A.

Subsequently, referring to block 142 of FIG. 1C, the method 100 performs additional etching processes to the workpiece 200 using the patterned fourth layer 210 as an etch mask to form a patterned third layer 208, a patterned second layer 206, and a patterned first layer 204 (referring to FIG. 23). Subsequently, referring to block 144 of FIG. 1C and to FIG. 24, the method 100 processes the substrate 202 using the patterned first layer 204 as a mask in, for example, an etching process. Other fabrication processes may also be applied to the substrate using the patterned first layer 204 as the mask. Referring to block 146 of FIG. 1C, the method 100 performs additional fabrication steps to the workpiece 200, similar to the discussion above with respect to block 132 of FIG. 1B. As such, the final pattern (i.e., the pattern 248) has a pitch 246 that is half of that of the original pattern 218, reducing the CD of the features formed on the workpiece 200. Notably, the inclusion of alternating layers of metal-free and metal-containing layers ensure that LWR of the reduced feature sizes brought about by the pitch-splitting method discussed above may be retained or even improved during successive etching processes.

Although not intended to be limiting, one or more embodiments of the present disclosure provide many benefits to a semiconductor device and a formation process thereof. For example, embodiments of a multi-layer photoresist structure including a metal-containing photoresist top layer and alternating layers of metal-free and metal-containing materials offers greater control over the lithographic patterning process by improving the multi-layer structure's sensitivity toward the exposure source as well as enhancing etching selectivity. As a result, opportunities for tuning and improving LER and/or LWR of IC features with reduced sizes may be afforded by embodiments provided herein.

In one aspect, the present disclosure provides a method that includes providing a substrate, forming a first layer over the substrate, forming a second layer over the first layer, forming a third layer over the second layer, forming a photoresist layer over the third layer, exposing the photoresist layer to a radiation source, and developing the photoresist layer to form a photoresist pattern.

In some embodiments, each of the first layer and the third layer is substantially free of any metallic element. In some embodiments, the second layer includes a first metallic element, while the photoresist layer includes a second metallic element. In some embodiments, the exposing of the photoresist layer polymerizes exposed portions of the photoresist layer.

In some embodiments, the forming of the first layer and the forming of the third layer each includes spin-coating a material that is substantially free of any metallic element, and the forming of the second layer includes depositing the first metallic element using one of chemical vapor deposition, physical vapor deposition, or atomic layer deposition. In further embodiments, the spin-coating the material includes spin-coating one of a carbon-rich polymer or silicon-rich polymer.

In some embodiments, the method further includes baking the first layer subsequent to the forming of the first layer and baking the third layer subsequent to the forming of the third layer.

In some embodiments, the first metallic element and the second metallic elements are the same. In some embodiments, the first metallic element is zirconium, tin, lanthanum, or manganese.

In some embodiments, the method further includes, prior to forming the photoresist layer, depositing a fourth layer over the third layer using one of chemical vapor deposition, physical vapor deposition, or atomic layer deposition, the fourth layer including a third metallic element such as zirconium, tin, lanthanum, or manganese, and spin-coating a fifth layer over the fourth layer, the fifth layer being substantially free of any metallic element. In some embodiment, the fifth layer includes a silicon-rich polymer.

In another aspect, the present disclosure provides another method that includes providing a substrate, forming a composite structure over the substrate that includes a first layer formed over the substrate, a second layer formed over the first layer, and a third layer formed over the second layer, forming a photoresist layer over the composite structure, exposing the photoresist layer, developing the photoresist layer to form a photoresist pattern, preforming a first etching process using the photoresist pattern as an etch mask to form a patterned third layer, performing a second etching process using the patterned third layer as an etch mask to form a patterned second layer, and performing a third etching process using the patterned second layer as an etch mask to form a patterned first layer.

In some embodiments, each of the first layer and the third layer is substantially free of any metallic element. In some embodiments, the second layer includes a first metallic element, while the photoresist layer includes a second metallic element. In some embodiments, the second layer is silicon-free.

In some embodiments, the first etching process removes portions of the third layer without substantially removing portions of the second layer. In some embodiments, the second etching process removes portions of the second layer without substantially removing portions of the first layer. In some embodiments, the third etching process removes portions of the first layer without substantially removing portions of the substrate.

In some embodiments, the performing of the first etching process and the third etching process each includes implementing one of an oxygen-containing gas, a carbon-containing gas, or a fluorine-containing gas. In further embodiments, the performing of the second etching process includes implementing one of a chlorine-containing gas, a bromine-containing gas, a nitrogen-containing gas, or a hydrogen-containing gas.

In some embodiments, the exposing of the photoresist layer is implemented by applying an extreme ultra-violet radiation source. In some embodiments, the photoresist layer is substantially free of any acid-generating moiety. In further embodiments, the second metallic element is zirconium, tin, cesium, barium, lanthanum, indium, silver, or cerium.

In yet another aspect, the present disclosure provides a method that includes spin-coating a first metal-free layer over a substrate, depositing a metal-containing layer over the first metal-free layer, spin-coating a second metal-free layer over the metal-containing layer, forming a photoresist layer over the second metal-free layer, wherein the photoresist layer includes a first metallic element, exposing the photoresist layer, and developing the photoresist layer to form a photoresist pattern. In some embodiments, the method further includes, subsequent to spin-coating each of the first metal-free layer and the second metal-free layer, baking each of the first metal-free layer and the second metal-free layer.

In some embodiments, the first metal-free layer includes a carbon-rich polymer, and wherein the second metal-free layer includes a silicon-rich polymer.

In some embodiments, the metal-containing layer includes a first metallic element, the first metallic element being zirconium, tin, cesium, barium, lanthanum, indium, silver, or cerium.

In some embodiments, the metal-containing layer includes a second metallic element, the second metallic element being indium, silver, or cerium, and wherein the first metallic element is manganese.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor substrate;
   forming a first layer over the semiconductor substrate, wherein the first layer includes a first metal;
   forming a second layer over the first layer, wherein the second layer is substantially free of any metal;
   forming a photoresist layer over the second layer, wherein the photoresist layer includes a second metal;
   exposing the photoresist layer to a radiation source; and
   developing the photoresist layer to form a photoresist pattern.

2. The method of claim 1, wherein forming the first layer includes depositing the first metal using one of chemical vapor deposition, physical vapor deposition, or atomic layer deposition, and wherein forming the second layer includes spin-coating a material that is substantially free of any metal.

3. The method of claim 2, wherein spin-coating includes spin-coating one of a carbon-rich polymer or silicon-rich polymer.

4. The method of claim 1, wherein the second metal is the same as the first metal.

5. The method of claim 1, wherein the first metal includes zirconium, tin, lanthanum, manganese, or combinations thereof.

6. The method of claim 1, wherein exposing the photoresist layer includes applying an extreme ultraviolet (EUV) source.

7. The method of claim 1, further comprising forming a third layer over the semiconductor substrate before forming the first layer, wherein the third layer is substantially free of any metal.

8. The method of claim 7, further comprising, before forming the photoresist layer:
depositing a fourth layer over the second layer using one of chemical vapor deposition, physical vapor deposition, or atomic layer deposition, wherein the fourth layer includes a third metal, the third metal including one of zirconium, tin, lanthanum, manganese, or combinations thereof; and
spin-coating a fifth layer over the fourth layer, wherein the fifth layer is substantially free of any metal.

9. A method, comprising:
forming a first layer over a substrate, wherein the first layer is substantially free of any metal;
forming a second layer over the first layer, wherein the second layer includes a first metal;
forming a third layer over the second layer, wherein the third layer is substantially free of any metal;
forming a photoresist layer over the third layer, wherein the photoresist layer includes metal-containing clusters;
exposing the photoresist layer; and
developing the photoresist layer to form a photoresist pattern.

10. The method of claim 9, wherein each of the metal-containing clusters includes a metal-containing core surrounded by a plurality of carbon-containing ligands.

11. The method of claim 10, wherein the metal-containing clusters are first metal-containing clusters, and wherein the exposing chemically joins together more than one metal-containing core of the first metal-containing clusters to form a second metal-containing cluster.

12. The method of claim 9, wherein the metal-containing clusters include a second metal different from the first metal.

13. The method of claim 9, further comprising:
preforming a first etching process using the photoresist pattern as an etch mask to form a patterned third layer, wherein the first etching process removes portions of the third layer without substantially removing portions of the second layer;
performing a second etching process using the patterned third layer as an etch mask to form a patterned second layer, wherein the second etching process removes portions of the second layer without substantially removing portions of the first layer; and
performing a third etching process using the patterned second layer as an etch mask to form a patterned first layer, wherein the third etching process removes portions of the first layer without substantially removing portions of the substrate.

14. The method of claim 13, wherein performing the first etching process and the third etching process each includes implementing one of an oxygen-containing gas, a carbon-containing gas, or a fluorine-containing gas.

15. The method of claim 13, wherein performing the second etching process includes implementing one of a chlorine-containing gas, a bromine-containing gas, a nitrogen-containing gas, or a hydrogen-containing gas.

16. A method, comprising:
forming a first non-metal layer over a substrate;
depositing a first metal layer over the first non-metal layer;
forming a second non-metal layer over the first metal layer;
depositing a second metal layer over the second non-metal layer;
forming a third non-metal layer over the second metal layer;
depositing a third metal layer over the third non-metal layer, wherein the third metal layer includes a metal-containing photosensitive material;
exposing the third metal layer; and
developing the exposed third metal layer to form a pattern in the third non-metal layer.

17. The method of claim 16, wherein the first non-metal layer includes a carbon-rich polymer, wherein the second non-metal layer includes a silicon-rich polymer, and wherein the third non-metal layer includes a carbon-rich polymer.

18. The method of claim 16, wherein the metal-containing photosensitive material includes a plurality of polymer chains, such that the exposing polymerizes the plurality of polymer chains.

19. The method of claim 16, wherein the metal-containing photosensitive material includes a plurality of clusters, and wherein each cluster includes a metal-containing core surrounded by a plurality of metal-free ligands.

20. The method of claim 19, wherein the metal-containing core includes a metal ion.

* * * * *